(12) United States Patent
Huang et al.

(10) Patent No.: US 9,412,807 B1
(45) Date of Patent: Aug. 9, 2016

(54) SEMICONDUCTOR STRUCTURE

(71) Applicant: NATIONAL TSING HUA UNIVERSITY, Hsinchu (TW)

(72) Inventors: Chih-Fang Huang, Hsinchu (TW);
Ting-Fu Chang, Hsinchu (TW);
Hua-Chih Hsu, Hsinchu (TW);
Jheng-Yi Jiang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/872,791

(22) Filed: Oct. 1, 2015

(30) Foreign Application Priority Data

Jun. 5, 2015 (TW) .............................. 104118288 A

(51) Int. Cl.
*H01L 23/58* (2006.01)
*H01L 29/06* (2006.01)

(52) U.S. Cl.
CPC .................................. *H01L 29/0619* (2013.01)

(58) Field of Classification Search
CPC ............ H01L 29/0634; H01L 29/0619; H01L 29/0696
USPC ......................................................... 257/487
See application file for complete search history.

(56) References Cited

U.S. PATENT DOCUMENTS 9,064,840 B2 *  6/2015  Zhang .................. H01L 29/0834
2006/0118818 A1 *  6/2006  Shimoida ............ H01L 29/0834
                                                                257/183

* cited by examiner

*Primary Examiner* — Theresa T Doan
(74) *Attorney, Agent, or Firm* — Muncy, Geissler, Olds & Lowe, P.C.

(57) ABSTRACT

A semiconductor structure comprises a substrate, an epitaxial layer, an active area and a termination. The substrate has a first conducting type of semiconductor material. The epitaxial layer disposed on the substrate has a first conducting type of semiconductor material. The active area is a working area of the semiconductor structure. The termination protects the active area. The termination has a junction termination extension (JTE) having a second conducting type of semiconductor material. The counter-doped area is disposed in the JTE area and has the first conducting type of semiconductor material. A dose of the first conducting type of semiconductor material in the counter-doped area increases along one direction.

12 Claims, 11 Drawing Sheets

SEMICONDUCTOR STRUCTURE

This application claims priority of No. 104118288 filed in Taiwan R.O.C. on Jun. 5, 2015 under 35 USC 119, the entire content of which is hereby incorporated by reference.

BACKGROUND OF THE INVENTION

1. Field of the Invention

The invention relates to a semiconductor structure, and more particularly to a counter-doped semiconductor structure.

2. Related Art

At present, commercial silicon-carbide products, such as diodes, metal oxide semiconductor field effect transistors (MOSFETs), junction field effect transistors (JFETs) and bipolar junction transistors (BJTs), have edge terminations being key functions for ensuring high-voltage operations.

Referring to the prior arts of FIGS. 1 to 5, a guard ring and a junction termination extension (JTE) are two important technological features of a plane edge terminal. FIG. 1 shows a P-type JTE of a single area. FIG. 2 shows a P-type JTE of a single area arranged in conjunction with an outer P-type guard ring. FIG. 3 shows P-type JTEs of two areas. FIG. 4 shows P-type JTEs of two areas arranged in conjunction with a P-type inner guard ring and an outer guard ring. FIG. 5 shows a P-type JTE of a single area arranged in conjunction with a P-type inner guard ring and an outer guard ring.

The prior art provides a semiconductor structure comprising an N-type silicon carbide layer 11 on which a P-type doped area 12 and a P-type JTE area 13 are disposed.

As shown in FIGS. 1 and 2, each of the structures is a single P-type JTE, wherein the structure of FIG. 2 is a P-type JTE of a single area arranged in conjunction with an outer guard ring 14. Each of FIGS. 3 and 4 shows P-type JTEs of two areas, wherein the structure of FIG. 4 comprises P-type JTEs of two areas arranged in conjunction with an outer guard ring 14. As shown in FIG. 5, an inner P-type guard ring 15 of the prior art is used to provide the same charge, so that the charge concentration of the P-type JTE is increased, and the object of adjusting the charges is achieved.

SUMMARY OF THE INVENTION

An object of the invention is to provide a counter-doped semiconductor structure.

Another object of the invention is to provide a counter-doped area disposed inside a JTE area.

The invention provides a semiconductor structure comprising a substrate, an epitaxial layer, a first JTE area, a second JTE area and a doped area. The substrate has a first conducting type of semiconductor material. The epitaxial layer disposed on the substrate has the first conducting type of semiconductor material. The first JTE area disposed in the epitaxial layer has a second conducting type of semiconductor material. The second JTE area is disposed in the epitaxial layer, contacts the first JTE area, and has the second conducting type of semiconductor material. The doped area is disposed in the epitaxial layer, contacts the first JTE area and has the second conducting type of semiconductor material. A dose of the second conducting type of semiconductor material in the first JTE area is lower than that in the second JTE area.

DETAILED DESCRIPTION OF THE INVENTION

Figure 6A:
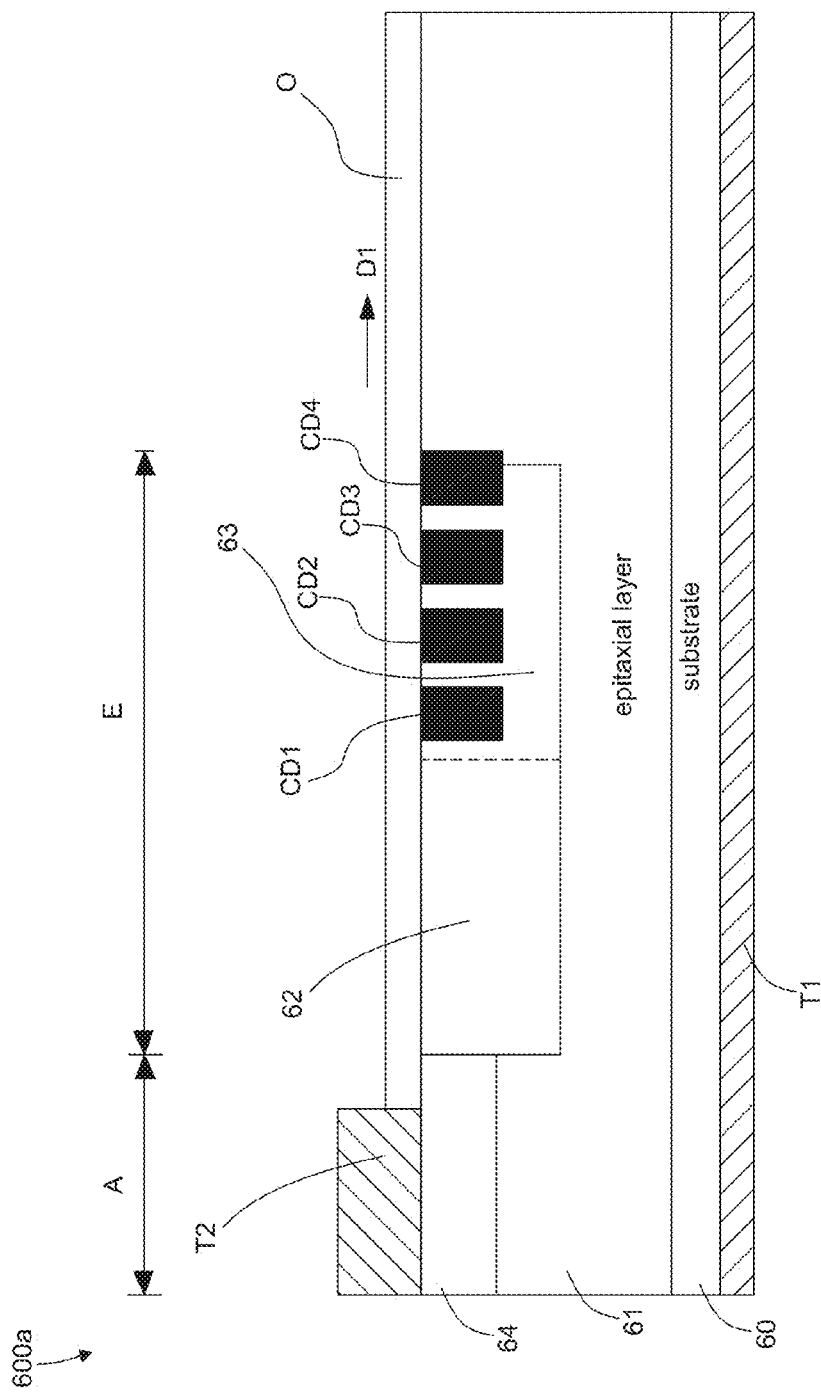
FIG. 6A is a schematically cross-sectional view showing a semiconductor structure according to one embodiment of the invention.

FIG. 6A is a schematically cross-sectional view showing a semiconductor structure according to one embodiment of the invention. Referring to FIG. 6A, a semiconductor structure 600a comprises a substrate 60, an epitaxial layer 61, a first JTE area 62, a second JTE area 63, a doped area 64 and counter-doped areas CD1 to CD4.

Please note that the first JTE area 62, the second JTE area 63 and the counter-doped areas CD1 to CD4 of the semiconductor structure 600a may be regarded as a termination E, while the doped area 64 and an electrode T2 may be regarded as an active area A. The termination E protects an operation of the active area A at a high voltage. The active area A is the main working area of the semiconductor structure 600a.

The active area A of this embodiment has a PIN diode structure in this example. However, the active area A may also be implemented by structures of Schottky diodes, metal oxide semiconductor field effect transistors (MOSFETs), junction field effect transistors (JFETs), insulation gate bipolar transistors (IGBTs), bipolar junction transistors (BJTs) and the like.

Also, the substrate 60 has the first conducting type of semiconductor material. In this embodiment, the substrate 60 is implemented by an N-type silicon carbide (4H—SiC N$^+$) substrate. The epitaxial layer 61 is disposed on the substrate 60 and has the first conducting type of semiconductor material. In this embodiment, the epitaxial layer 61 is implemented by an N-type epitaxial layer (N$^-$ Epi-layer). However, the invention should not be restricted thereto.

The first JTE area 62 is disposed in the epitaxial layer 61 and has a second conducting type of semiconductor material. Identically, the second JTE area 63 is also disposed in the epitaxial layer 61, contacts the first JTE area 62, and has the second conducting type of semiconductor material. The doped area 64 is disposed in the epitaxial layer 61, contacts the first JTE area 62 and has the second conducting type of semiconductor material.

In this invention, the first conducting type of semiconductor material and the second conducting type of semiconductor material have different conducting types. In other words, when the epitaxial layer 61 of this embodiment is an N-type epitaxial layer, the first JTE area 62 and the second JTE area 63 are P-type JTE areas.

Furthermore, the invention performs the dose control through a plurality of counter-doped areas in the second JTE area 63. In this embodiment, four counter-doped areas CD1 to CD4 are present. However, the invention should not be restricted thereto.

The second JTE area 63 comprises four counter-doped areas CD1 to CD4 having the first conducting type of semiconductor material, which is the N-type semiconductor material in this embodiment, wherein the doses of the N-type semiconductor materials of the counter-doped areas CD1 to CD4 may be adjusted according to the requirements. In other words, the doses of the second conducting type of semiconductor materials in the first JTE area 62 and the second JTE area 63 are adjusted according to the widths or doses of the N-type semiconductor materials of the counter-doped areas CD1 to CD4.

It is to be noted that the dashed line for separating the first JTE area 62 from the second JTE area 63 in FIG. 6A only represents that after the counter-doped areas CD1 to CD4 are formed in the second JTE area 63, the doses of the second conducting type of semiconductor materials of the first JTE area 62 and the second JTE area 63 have the difference of locality. That is, the dose of the second conducting type of semiconductor material of the second JTE area 63 where the counter-doped areas CD1 to CD4 are located is increased. So, the doses of the second conducting type of semiconductor materials of the first JTE area 62 and the second JTE area 63 are different from each other.

Please refer to the doses of the P-type semiconductor materials of the first JTE area 62 and the second JTE area 63 of this embodiment. Because the doses of the N-type semiconductor materials of the counter-doped areas CD1 to CD4 increase along a direction D1, the semiconductor structure 600 may have the counter-doped areas CD1 to CD4 through the second JTE area 63. Thus, the dose of the P-type semiconductor material of the second JTE area 63 linearly or non-linearly decreases along the direction D1 because the N-type semiconductor material is doped, and the direction D1 is away from the first JTE area 62. Therefore, the doses of the P-type semiconductor materials of the first JTE area 62 and the second JTE area 63 have the multi-area effect because the counter-doped areas CD1 to CD4 are doped with the N-type semiconductor materials. In other words, the dose of the second conducting type of semiconductor material in the first JTE area 62 is higher than that of the second JTE area 63.

In this embodiment, the doses of the counter-doped areas CD1 to CD4 range from $1 \times 10^{11}$ to $1 \times 10^{14}/cm^2$, and the depth of the first counter-doped area in the second JTE area 63 ranges from 0.1 to 3 um (microns).

In another embodiment, the order of the widths and doses of the N-type semiconductor materials of the counter-doped areas CD1 to CD4 is CD4 >CD3 >CD2 >CD1. In other words, the width or dose of the N-type semiconductor material of the counter-doped area CD4 on the edge of the second JTE area 63 is higher than the doses of the other counter-doped areas CD1 to CD3.

In another embodiment, the neighboring counter-doped areas have the dose difference of 80%. That is, the dose of the N-type semiconductor material of the counter-doped area CD1 is equal to 80% of the dose of the N-type semiconductor material of the counter-doped area CD2.

In addition, a partial area of the counter-doped area CD4 of the structure 600*a* is disposed outside the second JTE area 63, and the semiconductor structure 600*a* further comprises electrodes T1 and T2 and a dielectric layer O. The substrate 60 is disposed on the electrode T1, and the electrode T2 is disposed on a portion of the doped area 64. The dielectric layer O contacts the electrode T2 and is disposed on another portion of the doped area 64, the first JTE area 62, the second JTE area 63 and the epitaxial layer 61. In this embodiment, the electrode T1 is implemented by a cathode, and the electrode T2 is implemented by an anode.

Figure 6B:
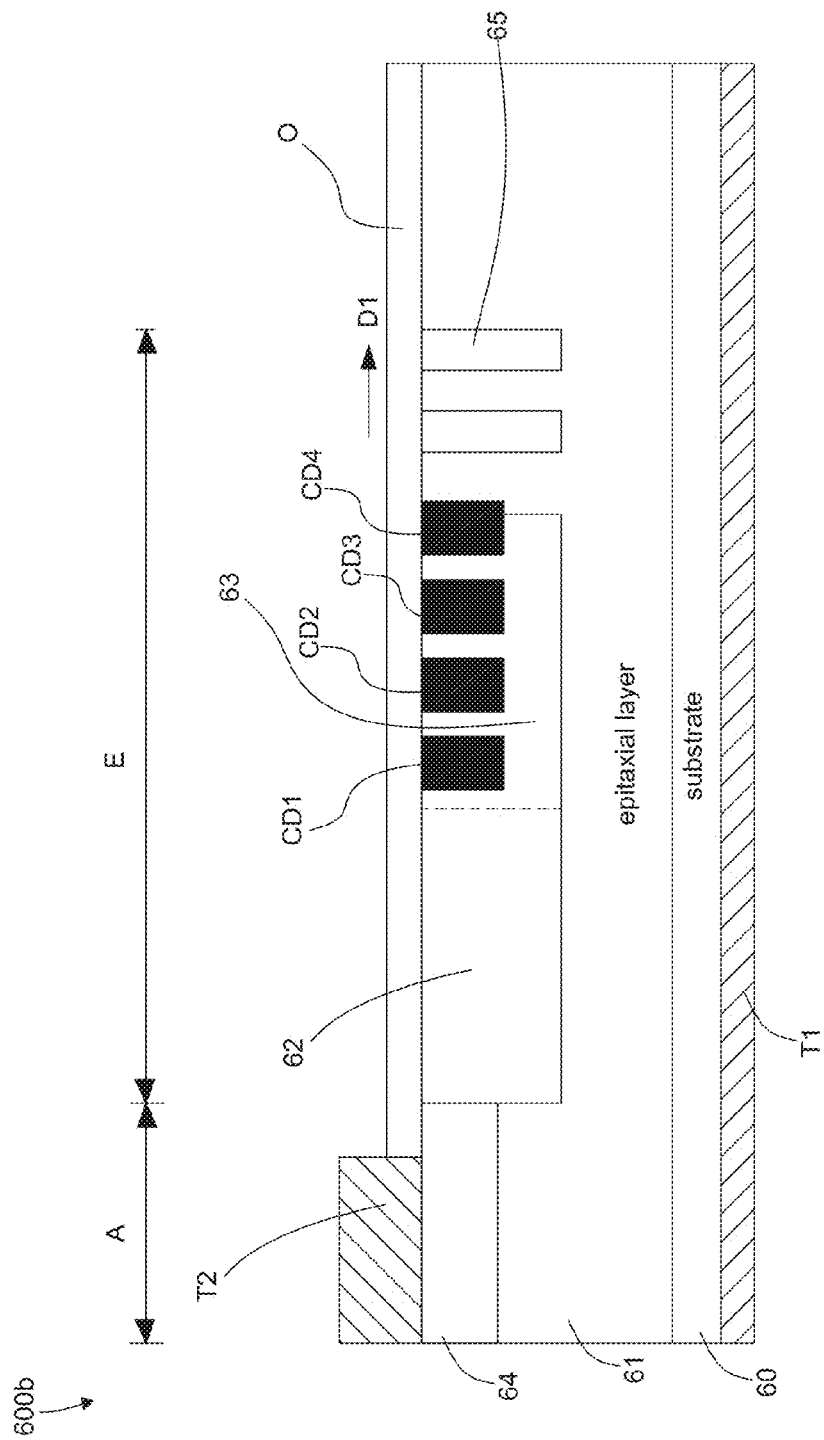
FIG. 6B is a schematically cross-sectional view showing a semiconductor structure according to one embodiment of the invention.

Next, please refer also to FIG. 6B. The difference between the semiconductor structures 600*b* and 600*a* resides in that the termination E of the semiconductor structure 600*b* comprises a third JTE area 65.

The substrate 60 is disposed on the electrode T1. The electrode T2 is disposed on a portion of the doped area 64. The dielectric layer O contacts the electrode T2 and is disposed on another portion of the doped area 64, the first JTE area 62, the second JTE area 63, the third JTE area 65 and the epitaxial layer 61.

The third JTE area 65 is disposed in the epitaxial layer 61. The third JTE area 65 is the same as the first JTE area 62 and the second JTE area 63, and has the P-type semiconductor material in this embodiment. The third JTE area 65 abuts upon the second JTE area 63. In one embodiment, the first JTE area 62, the second JTE area 63 and the third JTE area 65 may be manufactured in the same manufacturing process.

Please note that this embodiment has two third JTE areas 65, which are not disposed in the first JTE area 62 and the second JTE area 63. The third JTE area 65 may be regarded as outer guard rings disposed outside the first JTE area 62 and the second JTE area 63, and is mainly for decreasing the electric field at the position of the third JTE area 65. The counter-doped areas CD1 to CD4 are regarded as inner guard rings disposed in the first JTE area 62 and the second JTE area 63. Wherein, two third JTE areas 65 have a separated region between the neighboring third JTE areas. In other words, third JTE areas 65 are not a continuous area.

Furthermore, the distances between the counter-doped areas CD1 to CD4 range from 0.1 to 10 um, the distance from the counter-doped area CD4 to the neighboring third JTE area 65 ranges from 0.1 to 10 um, and the distance between the neighboring third JTE areas 65 ranges from 0.1 to 10 um. Because the partial area of the counter-doped area CD4 is disposed outside the second JTE area 63, the width of the counter-doped area CD4 extending out of the second JTE area 63 may range from 0.1 to 10 um.

Please note that the breakdown voltage of this embodiment is higher than that of the prior art because a portion of the counter-doped area CD4 extends out of the second JTE area 63.

The characteristics of the semiconductor structures 600*a* and 600*b* of the invention reside in adding the counter-doped areas CD1 to CD4 into the p-type second JTE area 62 to decrease the dose of the P-type semiconductor material of the second JTE area. In addition, the doses of the counter-doped areas CD1 to CD4 can be adjusted according to the positions and the widths of the areas, so that the first JTE area 62 and the second JTE area 63 achieve the effect of the multi-zone.

Figure 1:
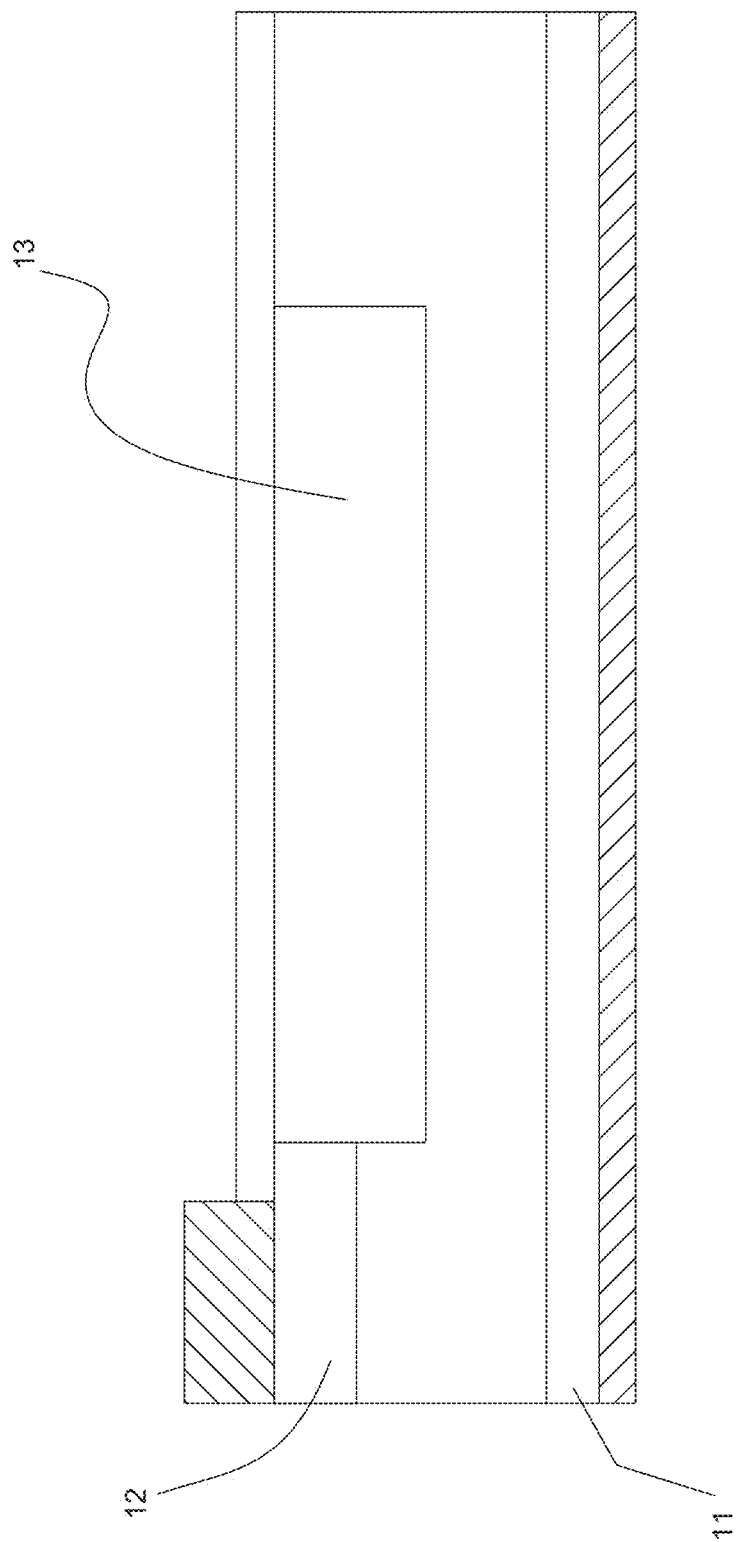
FIGS. 1 to 5 are schematically cross-sectional views showing conventional semiconductor structures.
Figure 2:
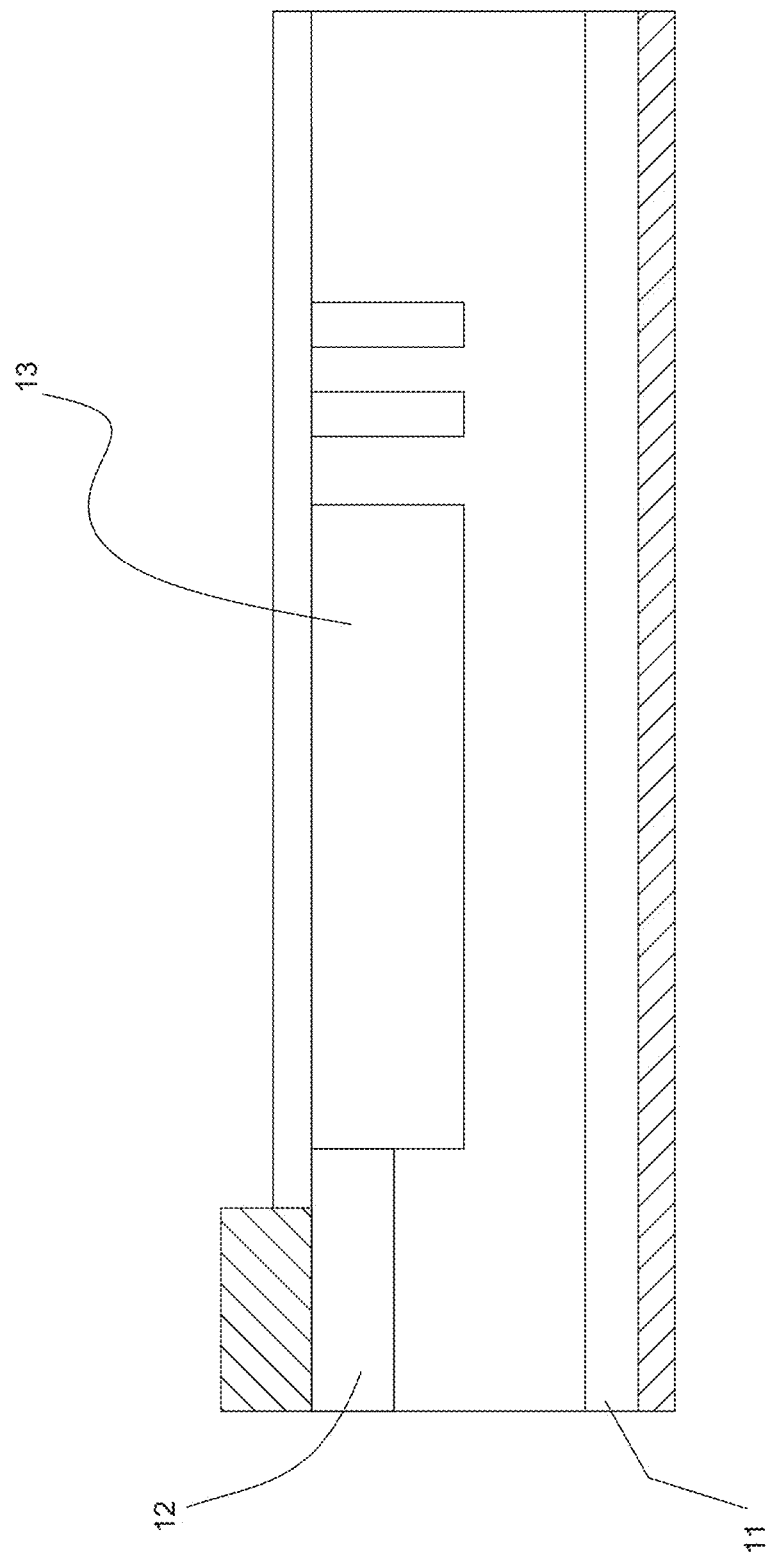
Figure 3:
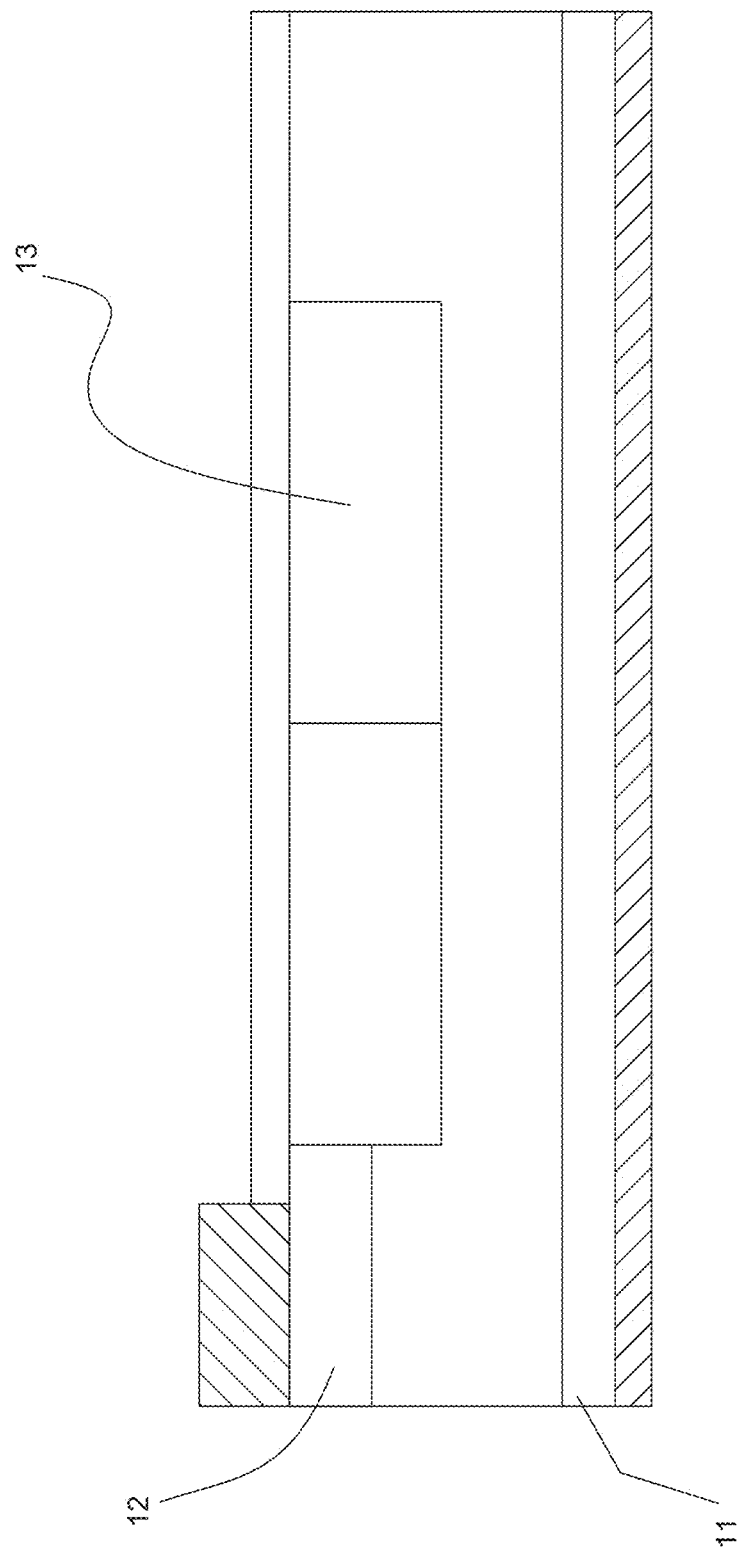
Figure 4:
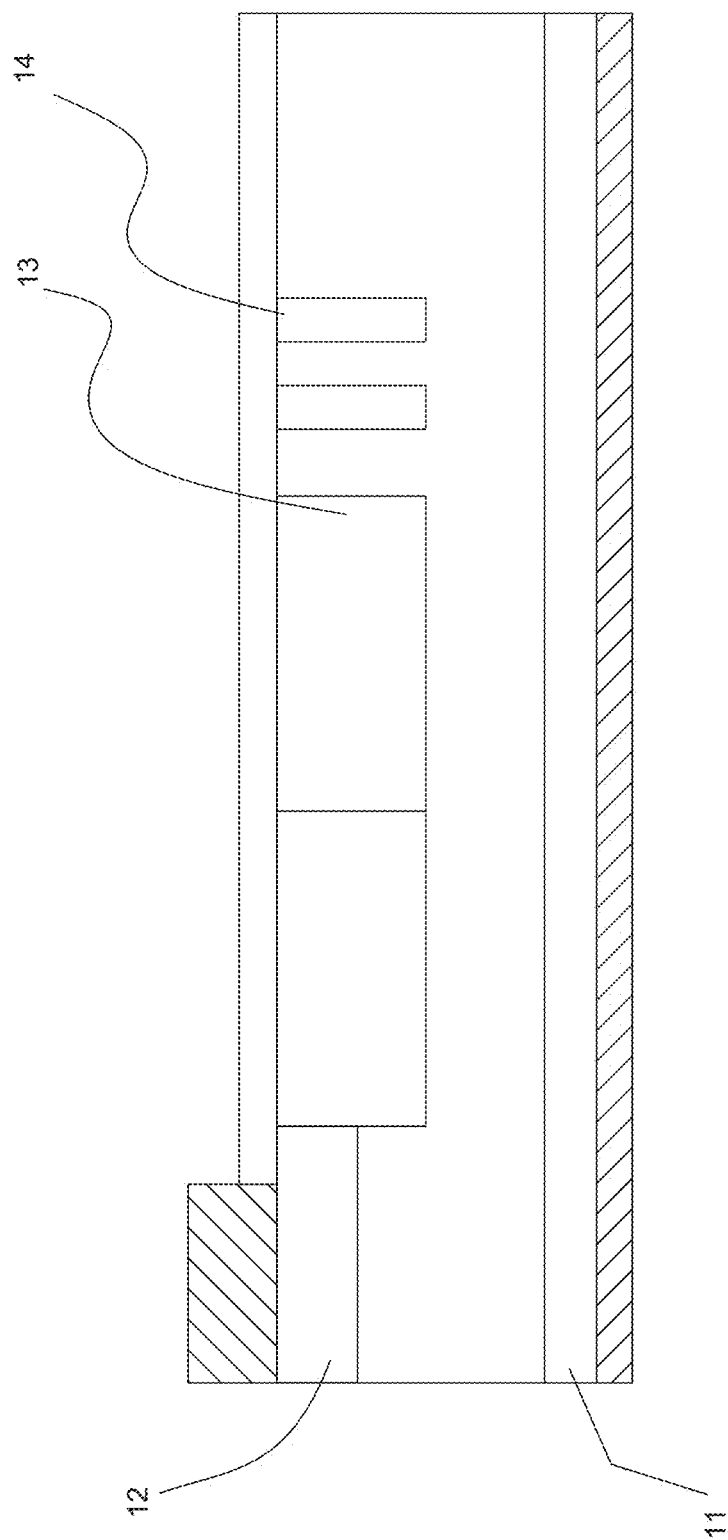
Figure 5:
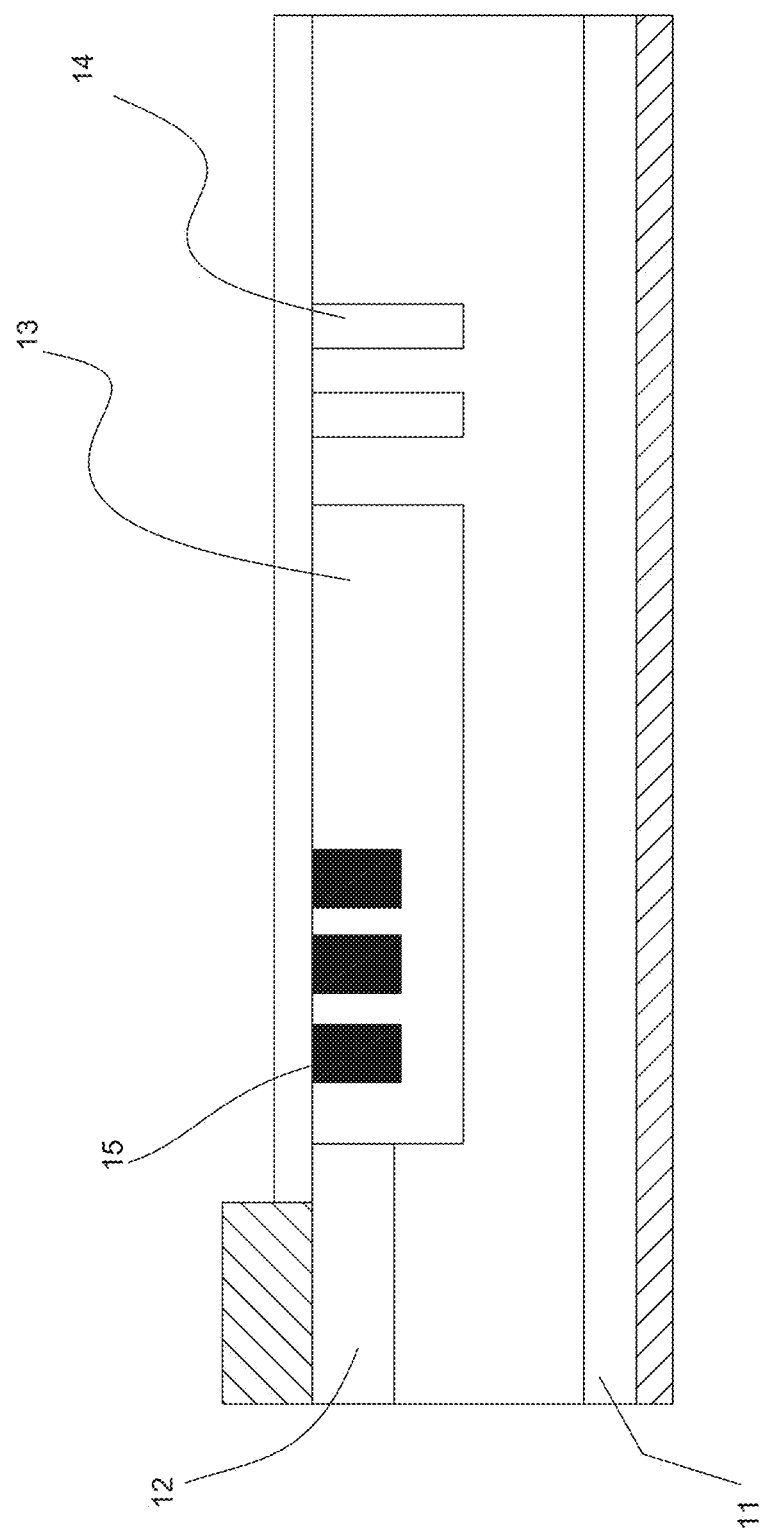
Figure 7:
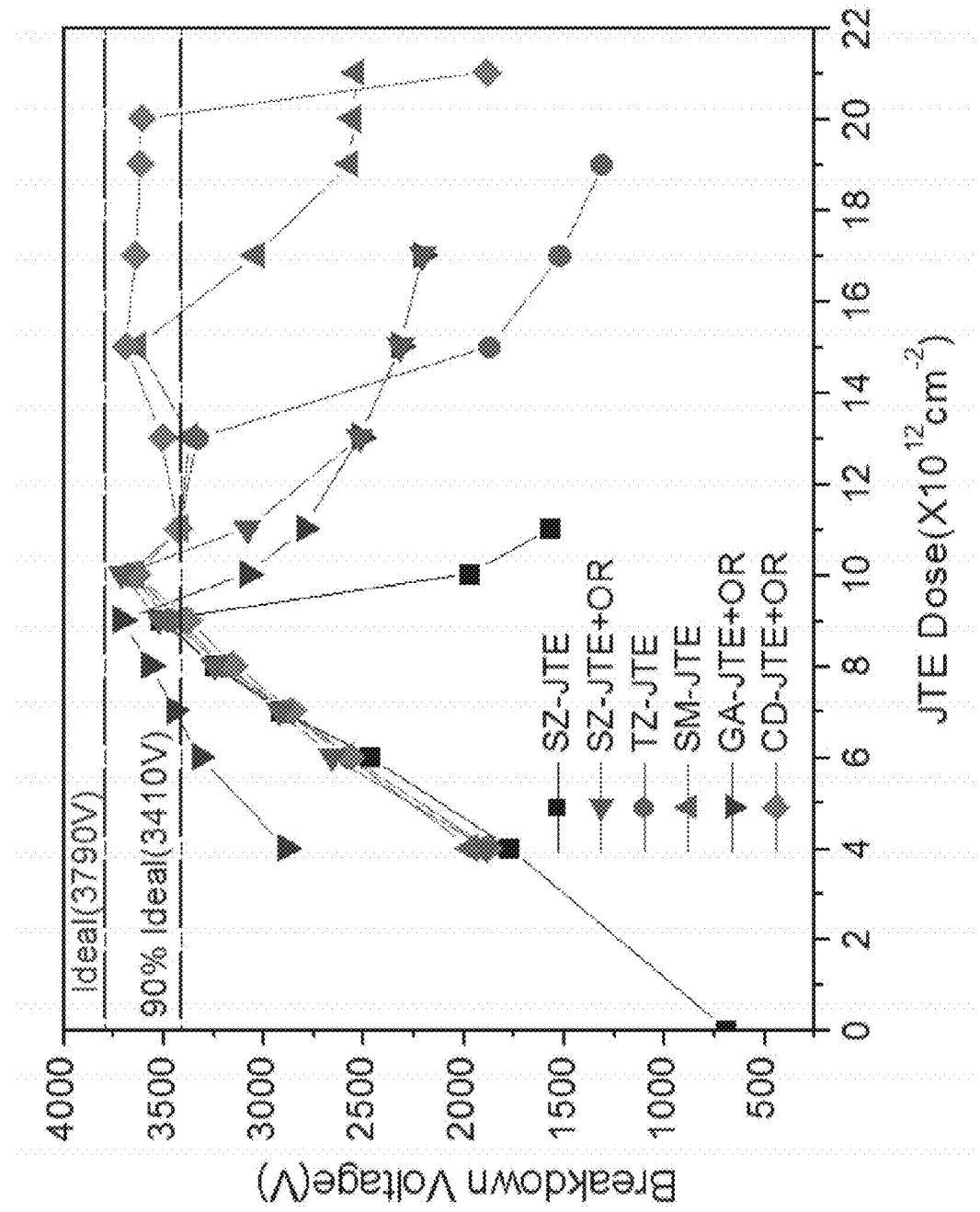
FIG. 7 is a comparison graph showing JTE area doses versus breakdown voltages in the prior art and the invention.

Please refer next to FIG. 7. FIG. 7 is a comparison graph showing JTE area doses versus breakdown voltages in the prior art and the invention, where SZ-JTE represents the P-type JTE structure of the single area (in contrast to the structure of FIG. 1), SZ-JTE represents the single area P-type JTE arranged in conjunction with the outer P-type guard ring (in contrast to the structure of FIG. 2), TZ-JTE represents the dual-area P-type JTE (in contrast to the structure of FIG. 3), SM-JTE represents the dual-area P-type JTE arranged in conjunction with the P-type inner guard ring and the outer guard ring (in contrast to the structure of FIG. 4), GA-JTE+OR represents the single area P-type JTE arranged in conjunction with the P-type inner guard ring and the outer guard ring (in contrast to the structure of FIG. 5), CD-JTE+OR represents the structure 600*b* of the invention, the horizontal axis represents the dose variation of the JTE area, and the vertical axis represents the maximum breakdown voltage that can be achieved.

As shown in FIG. 7, the CD-JTE-+OR structure has the broad JTE dose variation area. Because the invention has the multi-section JTE area and is arranged in conjunction with the outer ring structure to form a combination, the JTE dose range is extended. That is, when the JTE area dose ranges from $9 \times 10^{12}$ cm$^{-2}$ to $20 \times 10^{12}$ cm$^{-2}$, the breakdown voltage thereof can be kept above 3500 V. Correspondingly, in the example of the SZ-JTE structure, the SZ-JTE structure shows a narrow area of the dose versus the breakdown voltage. That is, after the JTE area dose exceeds $9 \times 10^{12}$ cm$^{-2}$, the breakdown voltage thereof decreases rapidly.

Figure 8:
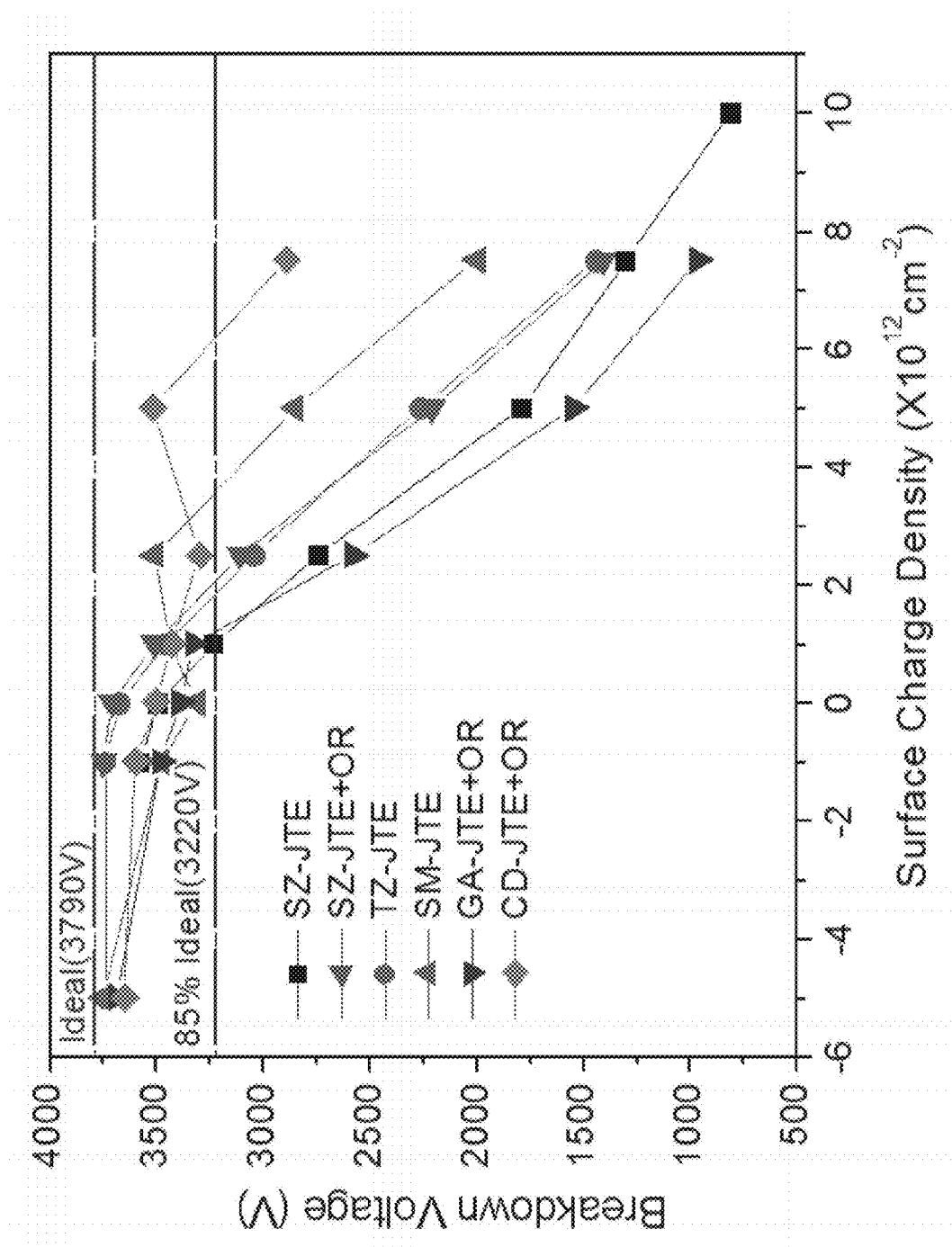
FIG. 8 is a comparison graph showing surface charges versus breakdown voltages in the prior art and the invention.

Please refer next to FIG. 8. FIG. 8 is a comparison graph showing surface charges versus breakdown voltages in the prior art and the invention. In the typical processes of manufacturing the semiconductor structure, positive or negative surface charges are present. When the surface charge is negative, the breakdown voltages of the prior art and the invention will not be affected, as shown in the drawing. However, when the surface charge is positive, the breakdown voltage of the conventional semiconductor structure decreases rapidly, but the characteristic of the CD-JTE+OR semiconductor structure of the invention can decrease the sensitivity to the surface charge. So, the breakdown voltage of this embodiment is not affected, and is still kept within a range.

Figure 9:
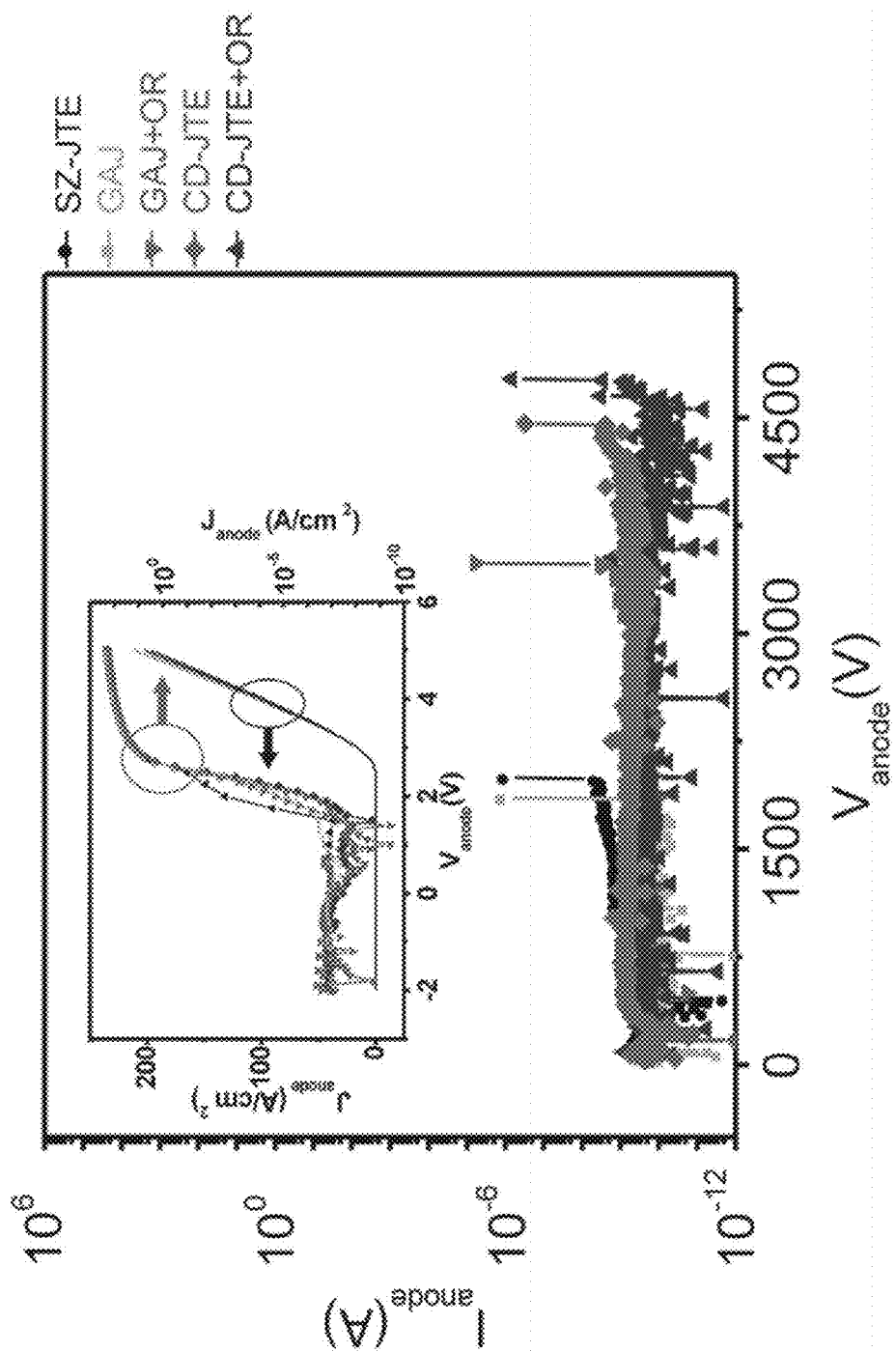
FIG. 9 is a comparison graph showing comparisons of voltage withstanding degrees in the prior art and the invention.

Please refer next to FIG. 9. FIG. 9 is a comparison graph showing comparisons of voltage withstanding degrees in the prior art and the invention, where CD-JTE represents the structure of one embodiment of the invention (i.e., the structure with the counter-doped area but without the outer guard ring); and CD-JTE+OR represents the structure of another embodiment of the invention (i.e., the structure with the counter-doped area and with the outer guard ring).

According to FIG. 9, it is obtained that after the dose adjustment is performed on the JTE area through the counter-doped area, the CD-JTE and the CD-JTE+OR can withstand the voltage higher than that of the prior art and the breakdown voltage thereof can be kept at about 4500 V, while the breakdown voltage of the prior art is only kept under 4000 V.

Please note that, in one embodiment, if the first conducting type of semiconductor material is the N-type semiconductor material, then the second conducting type of semiconductor material is the P-type semiconductor material. On the contrary, if the first conducting type of semiconductor material is the P-type semiconductor material, then the second conducting type of semiconductor material is the N-type semiconductor material.

Figure 10:
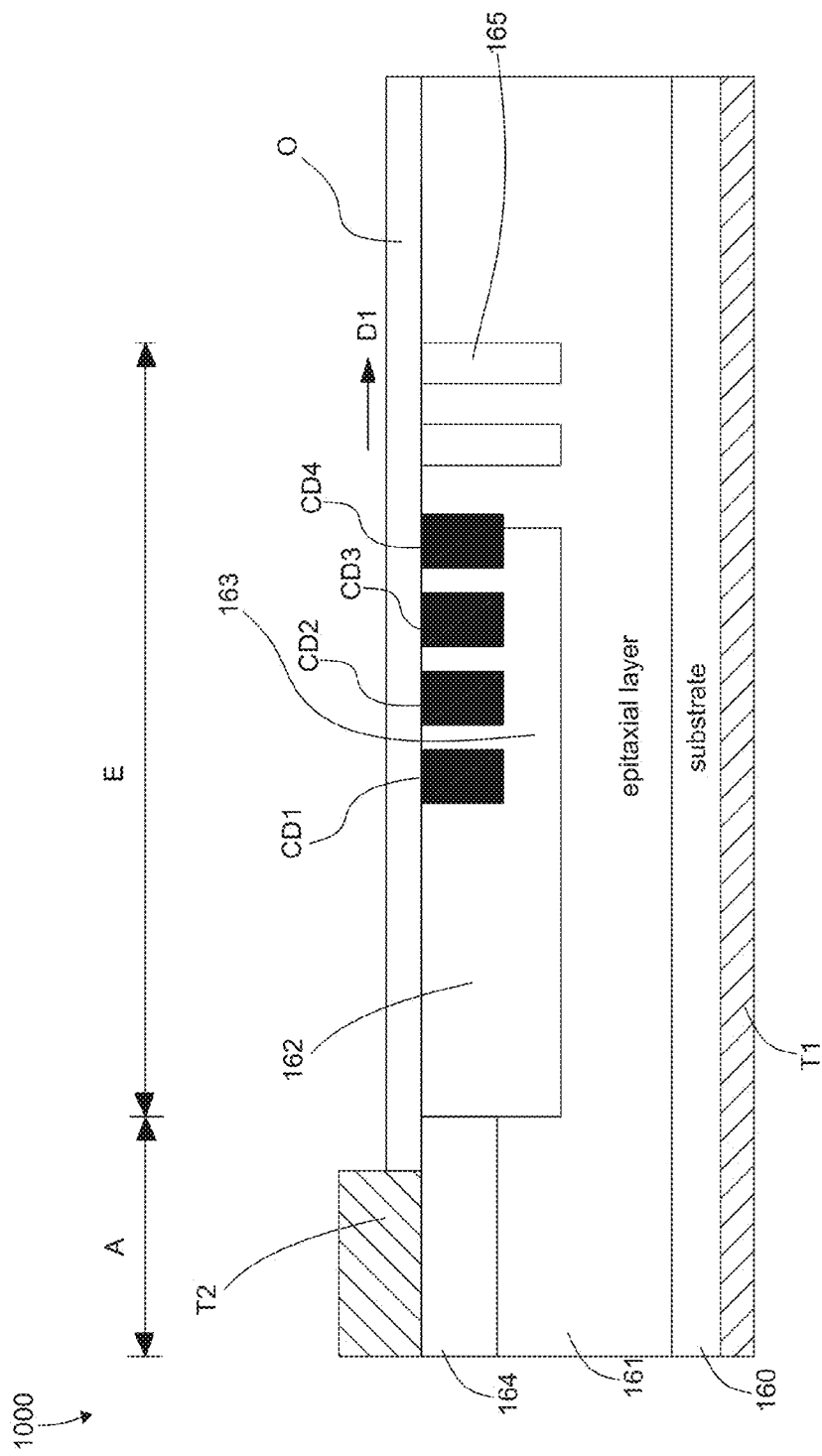
FIG. 10 is a schematically cross-sectional view showing a semiconductor structure according to one embodiment of the invention.

Please refer next to FIG. 10. FIG. 10 is a schematically cross-sectional view showing a semiconductor structure according to one embodiment of the invention. The difference between the semiconductor structure 1000 of this embodiment and the semiconductor structure 600b resides in that the first conducting type of semiconductor material of the semiconductor structure 1000 is the P-type semiconductor material, and the second conducting type of semiconductor material of the semiconductor structure 1000 is the N-type semiconductor material. That is, the substrate 160 of this embodiment is implemented by the P-type silicon carbide substrate; the epitaxial layer 161 is implemented by a P-type epitaxial layer; the doped area 164, the first JTE area 162, the second JTE area 163 and the third JTE area 165 have the N-type semiconductor material; the counter-doped areas CD1 to CD4 have the P-type semiconductor material; the electrode T1 is still the cathode; and the electrode T2 is implemented by the anode. The other structures and principles are the same as those mentioned hereinabove, and detailed descriptions thereof will be omitted.

In summary, the semiconductor structure of the invention is implemented using the counter-doping method, so that the original dose of the semiconductor material of the original JTE area decreases, the manufacturing processes are simplified, the maximum breakdown voltage can be kept, and the maximum breakdown voltage of the breakdown voltage to the surface charge can be decreased.

What is claimed is:

1. A semiconductor structure, comprising:
   a substrate having a first conducting type of semiconductor material;
   an epitaxial layer, which is disposed on the substrate and has the first conducting type of semiconductor material;
   an active area being a working area of the semiconductor structure; and
   a termination for protecting the active area, the termination comprising:
   a first junction termination extension (JTE) area, which is disposed in the epitaxial layer and has a second conducting type of semiconductor material;
   a second JTE area, which is disposed in the epitaxial layer and contacts the first JTE area, wherein the second JTE area has the second conducting type of semiconductor material; and
   at least a first counter-doped area, which has the first conducting type of semiconductor material and is disposed in the second JTE area;
   wherein the first conducting type of semiconductor material and the second conducting type of semiconductor material have different conducting types.

2. The semiconductor structure according to claim 1, wherein a dose of the first conducting type of semiconductor material in the first counter-doped area changes according to a width or a dose of the first counter-doped area.

3. The semiconductor structure according to claim 2, wherein the dose of the first conducting type of semiconductor material in the first counter-doped area linearly or non-linearly increases along one direction.

4. The semiconductor structure according to claim 3, wherein the direction is away from the first JTE area.

5. The semiconductor structure according to claim 4, wherein a partial area of the first counter-doped area is disposed outside the second JTE area.

6. The semiconductor structure according to claim 5, wherein the active area comprises:
   a doped area, which is disposed in the epitaxial layer, contacts the first JTE area and has the second conducting type of semiconductor material; and
   a first electrode, wherein the substrate is disposed on the first electrode.

7. The semiconductor structure according to claim 6, further comprising:
   a second electrode, disposed on a portion of the doped area;
   a dielectric layer, which contacts the second electrode and is disposed on another portion of the doped area, the first JTE area, the second JTE area and the epitaxial layer; and
   at least a third JTE area, which is disposed in the epitaxial layer, has the second conducting type of semiconductor material, and abuts upon the third JTE area and the second JTE area.

8. The semiconductor structure according to claim 5, wherein when the first conducting type of semiconductor material is an N-type conducting type material, the second conducting type of semiconductor material is a P-type conducting type material; and when the first conducting type of semiconductor material is a P-type conducting type material, the second conducting type of semiconductor material is an N-type conducting type material.

9. The semiconductor structure according to claim 1, wherein a dose of the first counter-doped area ranges from $1\times10^{11}$ to $1\times10^{14}$/cm$^2$, and a depth of the first counter-doped area in the second JTE area ranges from 0.1 to 3 um.

10. The semiconductor structure according to claim 7, further comprising:
two third JTE areas, have a separated region between the neighboring third JTE areas;
wherein, the third JTE areas are not a continuous area.

11. A semiconductor structure, comprising:
a substrate having a first conducting type of semiconductor material;
an epitaxial layer, which is disposed on the substrate, and has the first conducting type of semiconductor material;
an active area being a working area of the semiconductor structure; and
a termination for protecting the active area, the termination comprising:
a junction termination extension (JTE) area, which is disposed in the epitaxial layer and has a second conducting type of semiconductor material; and
at least a counter-doped area, which has the first conducting type of semiconductor material and is disposed in the JTE area, wherein the counter-doped area has a predetermined depth in the JTE area, and a portion of the counter-doped area extends out of an edge of the JTE area and contacts the epitaxial layer;
wherein the first conducting type of semiconductor material and the second conducting type of semiconductor material have different conducting types; and a dose of the first conducting type of semiconductor material in the counter-doped area increases along one direction.

12. The semiconductor structure according to claim 11, wherein a dose of the counter-doped area ranges from $1\times10^{11}$ to $1\times10^{14}$/cm$^2$, and a predetermined depth of the first counter-doped area in the JTE area ranges from 0.1 to 3 um.

* * * * *